Sept. 9, 1969 G. P. HOUCKE ET AL 3,466,467

SOLID STATE SWITCHING CIRCUIT

Filed May 23, 1966 3 Sheets-Sheet 1

INVENTORS G. P. HOUCKE
T. A. SMITH
BY

Charles Scott Phelan
ATTORNEY

SOLID STATE SWITCHING CIRCUIT

Filed May 23, 1966

United States Patent Office 3,466,467

Patented Sept. 9, 1969

3,466,467

SOLID STATE SWITCHING CIRCUIT

George P. Houcke, Tenafly, N.J., and Todd A. Smith, Brooklyn, N.Y., assignors to Bell Telephone Laboratories, Incorporated, Murray Hill and Berkeley Heights, N.J., a corporation of New York Filed May 23, 1966, Ser. No. 552,255
Int. Cl. H03k 17/56
U.S. Cl. 307—252 17 Claims

ABSTRACT OF THE DISCLOSURE

A control transistor and a silicon controlled rectifier (SCR) are arranged in a series AND gate that includes a voltage divider providing an enabling bias to the SCR gate electrode. On and off signals are applied to the control transistor base. Even though high voltage is applied across the series collector-emitter path of the AND gate, the control transistor is not destroyed by punch-through when it is turned off because the control transistor collector potential, as it rises, back biases the gate-cathode junction. This back bias cooperates with decreasing current through the control transistor for turning off the SCR before punch-through occurs.

This invention is a solid state switching circuit that is more particularly described as a transistor-controlled semiconductor switching circuit used for opening and closing a conducting path that is supplied by a voltage greater than punch-through voltage of a control transistor.

In the prior art, a switching transistor has been connected in a series circuit with the anode-cathode path of a silicon controlled rectifier (SCR) to control conduction through the SCR. Use of the switching transistor in series circuit with the SCR has heretofore been limited to circuits in which supply voltage of the circuit is less than punch-through voltage of the transistor. Punch-through voltage of a transistor is that value of collector-emitter voltage which causes direct collector to emitter conduction without a base drive current. The transistor is likely to be destroyed if the supply voltage is greater than punch-through voltage and the circuit has been conducting just prior to a time at which the transistor is turned off. The transistor is destroyed because the SCR tends to continue conducting after the transistor is turned off and thereby applies the supply voltage across the emitter and collector electrodes of the transistor. As soon as the transistor is turned off and its collector-emitter voltage rises to the punch-through voltage, the transistor is destroyed by direct collector to emitter conduction. The supply voltage may, however, exceed punch-through voltage without damaging the transistor when the SCR and the transistor are both conducting because transistor action produces a low collector-emitter voltage as long as the transistor is operated in saturation. Therefore, in prior art transistor circuits, punch-through voltage has been the limit for supply voltage.

As a result, transistors and semiconductors have been excluded from some possible uses, for instance, where a semiconductor switching circuit has appeared to be desirable as a replacement for a switching pentode vacuum tube that is used to drive telegraph hub circuits or loop circuits and is operated in a cut-off condition for long periods of time. The pentode tube develops cathode interface, a build-up of cathode structural resistance that reduces cathode and plate currents and causes an excessive rate of tube failure and high maintenance costs. The pentode tube, however, is used in a circuit that is supplied by a voltage much greater than punch-through voltage of transistors. Since a semiconductor switching circuit is not subject to cathode interface, it would reduce circuit failure rate and maintenance costs if the problem concerning transistor destruction by high supply voltage is overcome. If high supply voltage is used for a semiconductor circuit, large output currents can be produced for driving load circuits. Some solutions for the problem, concerning transistor destruction by high voltage, have been disclosed in the prior art, but those solutions have not been fully satisfactory.

Therefore it is an object of this invention to provide an economical replacement for a pentode electron tube used for switching.

It is also an object of this invention to develop a semiconductor switching circuit that plugs into the tube socket of an electron tube and operates as a direct replacement for the electron tube.

It is a further object of this invention to produce on-off output signals in response to on-off input signals by means of a semiconductor switching circuit that uses a supply voltage greater than punch-through voltage of a control transistor.

These and other objects of the invention are realized in an illustrative embodiment thereof in which a transistor and a silicon controlled rectifier (SCR) are arranged in a series AND gate that includes a fixed, or continuous, enabling voltage biasing the gate electrode of the silicon controlled rectifier. The enabling voltage is less than the punch-through voltage of the transistor. The AND gate is turned on and off by signals applied to the transistor base and the enabling voltage helps turn off the silicon controlled rectifier before collector potential on the transistor rises enough to cause punch-through of the transistor.

A feature of the invention is an encapsulated semiconductor switching circuit that plugs into a tube socket and operates as a direct replacement for a vacuum tube in a two-state switching circuit.

Another feature of the invention is a fixed enabling voltage coupled to a gate electrode of a silicon controlled rectifier arranged in a series AND gate with a transistor so that a supply voltage greater than punch-through voltage of the transistor does not punch-through the transistor when an input signal to the base electrode of the transistor turns off the transistor.

Another feature of the invention is a two-state semiconductor switching circuit having a feedback path from a series AND gate to an input of the circuit for delaying circuit response and assuring that the circuit does not change from a first state to a second state and vice versa in response to minor fluctuations of input signal.

A further feature of the invention is a transistor controlling conduction of a plurality of silicon controlled rectifiers having bridged input electrodes and isolated output circuits each supplied by a voltage greater than punch-through voltage of the transistor.

A still further feature of the invention is a first transistor and a silicon controlled rectifier arranged in a series AND gate and interconnected with a second transistor that increases base drive current to the first transistor in response to rising potential on a collector electrode of the first transistor.

A better understanding of the invention may be derived from the detailed description following if that description is considered with respect to the attached drawings in which.

Figure 1:
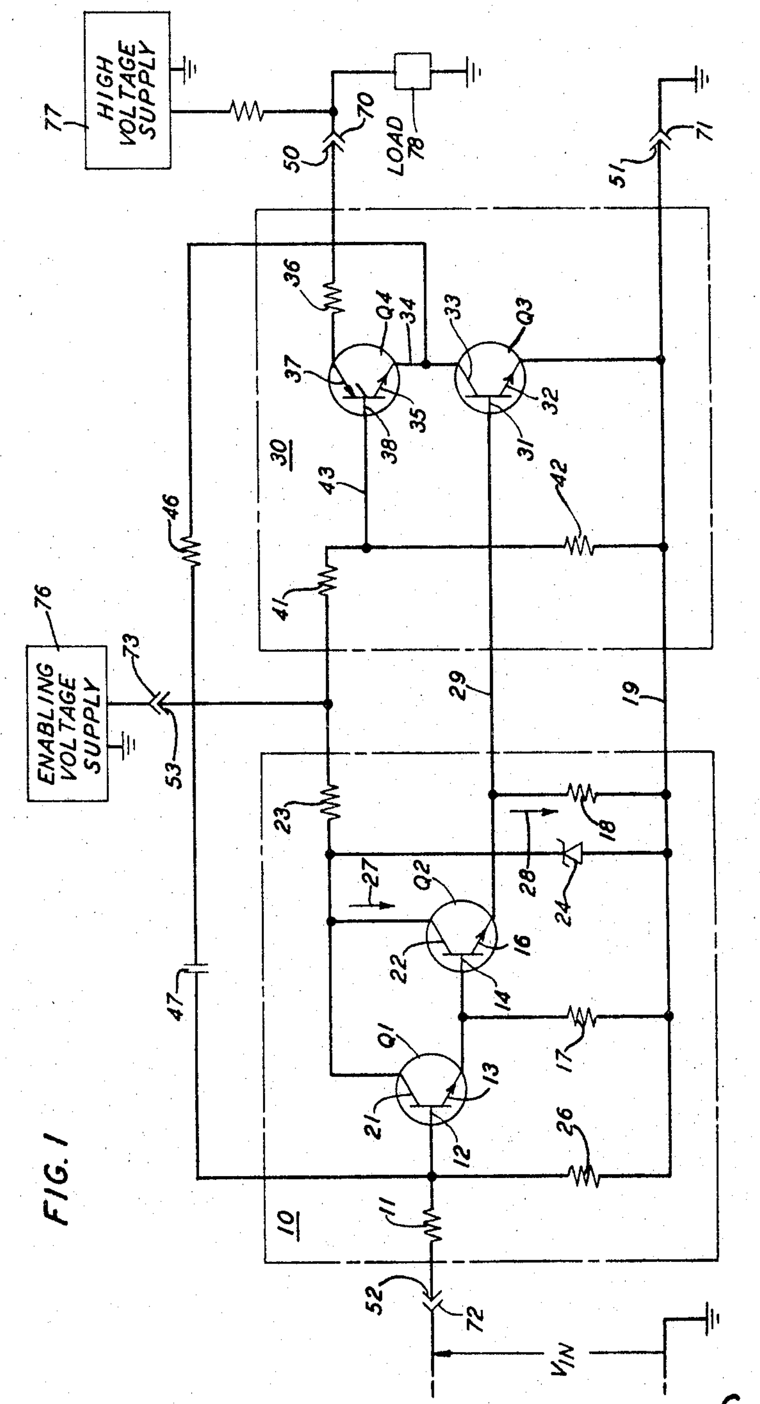
FIG. 1 is a schematic diagram of a first embodiment of a transistor-controlled semiconductor switching circuit in accordance with the invention.

Referring now to FIG. 1, there is shown a two-state semiconductor switching circuit in accordance with the present invention. The circuit of the invention is described in terms of its application as a plug-in substitute for a switching pentode electron tube used in telegraph transmission. As such a substitute, it includes no voltage sources of its own because it couples directly to the input, output, and supply connections otherwise used by the pentode tube it replaces. The circuit includes a two-transistor amplifier input section 10 and an AND gate output section 30 that produce large current signals through output terminals 50 and 51 in response to input signals applied to an input terminal 52.

The input section 10 is a high-current gain amplifier comprising two NPN transistors Q1 and Q2 that conduct in saturation only when a positive polarity input signal is coupled to the input terminal 52 from an output terminal 72 of an external circuit. A resistor 11 couples input signals from the input terminal 52 to a base input electrode 12 of the transistor Q1. An emitter electrode 13 of the transistor Q1 is connected to a base electrode 14 of the transistor Q2. The emitter electrode 13 and an emitter electrode 16 of the transistor Q2 are coupled respectively by way of resistors 17 and 18 to a lead 19 that is connected to the terminal 51. The terminal 51 is coupled through a terminal 71 of an external circuit to a source of reference potential, illustratively shown as ground. In a typical telegraph application, the reference potential is a negative voltage but for clarity of description in this disclosure the illustrative ground is used. A collector electrode 21 of the transistor Q1 and a collector electrode 22 of the transistor Q2 are coupled via a resistor 23 to a terminal 53. The terminal 53 is coupled through a terminal 73 of an external circuit to a fixed, or continuous, positive polarity enabling voltage supply 76. In a typical telegraph application, the terminal 53 is coupled to a potential of approximately earth-ground but more significantly is a positive potential relative to the reference potential shown here as ground. A reverse breakdown diode 24 couples the collector electrodes 21 and 22 to the lead 19, and a resistor 26 couples the base input electrode 12 of the transistor Q1 to the lead 19.

When this invention is coupled to the terminals 71, 72, and 73, the input section 10 conducts if an input signal $V_{in}$ of positive polarity with respect to the reference potential is applied to the input terminal 52 so that the positive signal appears across the resistor 26. The input section 10 is cut off if the input signal $V_{in}$ has a negative polarity with respect to the reference potential. The enabling voltage supply 76 is coupled to the terminal 53 so that a current flows through the resistor 23, the diode 24, the lead 19, and the terminal 51 to the reference potential. The diode 24 establishes a collector supply potential for operating the transistors Q1 and Q2 in saturation in response to the positive polarity input signal applied to the terminal 52. When the transistors Q1 and Q2 conduct, a current is conducted through the transistor Q2 in the direction of an arrow 27 and through the resistor 18 in the direction of an arrow 28. A positive polarity signal is therefore produced on a lead 29. When the transistors Q1 and Q2 are cut off, substantially no current is conducted through the resistor 18, and therefore no significant positive polarity signal is produced on the lead 29.

The output section 30 includes an NPN control transistor Q3 and a silicon controlled rectifier (SCR) Q4 arranged in an AND gate that conducts a large current from the terminal 50 to the terminal 51 in response to positive polarity signals applied to a base electrode 31 of the transistor Q3. The transistor Q3 is arranged for saturated operation during conduction. The SCR is a switching device having a gate electrode, two output electrodes (cathode and anode), and a breakover voltage greater than punch-through voltage between one output electrode and the other output electrode when no current flows through the gate electrode. The AND gate is cut off when positive polarity signals are not applied to the base electrode 31. The transistor Q3 has an emitter electrode 32 connected by way of the lead 19 to the terminal 51 and a collector electrode 33 connected by way of a lead 34 to a cathode electrode 35 of the SCR. A resistor 36 couples the terminal 50 to an anode electrode 37 of the SCR for limiting current flow in the path from the terminal 50 to the terminal 51 when the SCR Q4 and the transistor Q3 are conducting. The terminal 50 is coupled through a terminal 70 of an external circuit to a positive polarity high voltage supply 77 and a load 78. The high voltage supply 77 and the load 78 have return paths to the reference potential of the terminal 71. A supply voltage greater than punch-through voltage of the transistor Q3 but less than breakover voltage of the SCR Q4 is coupled from the high voltage supply 77 to the terminal 50 for producing output current in the output circuit path from terminal 50 to terminal 51. Breakover voltage is the maximum positive voltage that can be applied between the cathode electrode 35 and the anode electrode 37 without switching the SCR into conduction unless a current flows through a gate electrode 38.

A voltage divider including two resistors 41 and 42 couples the terminal 53 to the terminal 51 for producing a fixed, or continuous, enabling voltage less than the punch-through voltage of the transistor Q3 across the resistor 42 when the enabling voltage supply 76 is coupled to the terminal 53. The positive enabling voltage across the resistor 42 is applied by way of a lead 43 to the gate electrode 38 of the SCR Q4 so that the SCR is enabled to conduct.

When this invention is coupled to the terminals 70, 71, 72, and 73 and a positive input signal is applied, the transistor Q3 is turned on. Upon termination of the positive signal, current through the transistor Q3 begins to reduce but the SCR Q4 tends to continue conduction. The potential on the collector electrode 33 commences to rise toward the supply voltage coupled to the output terminal 50 and would cause punch-through of the transistor Q3 except for the enabling voltage applied to the gate electrode 38. This enabling voltage causes a back bias on the gate-cathode junction of the SCR Q4 as soon as the potential on the collector electrode 33 tends to rise above the enabling voltage. The back bias on the gate-cathode junction co-operates with the current reduction, caused by turn-off of transistor Q3, to turn off the SCR Q4 before the collector potential on transistor Q3 rises significantly relative to the punch-through voltage of the transistor Q3.

The output current between the terminals 50 and 51 may be used, for example, to produce signals for driving a typical telegraph hub shown as the load 78. The voltage variations at terminal 70 are negative-going when Q4 conducts and they indicate a spacing condition. A marking condition is indicated when Q4 is nonconducting.

A feedback loop including a resistor 46 and a capacitor 47 couples the potential on the collector electrode 33 of transistor Q3 to the base electrode 12 of transistor Q1. The base input electrode 12 is considered to be part of the input to the circuit of this invention. The feedback loop improves output waveforms by assuring that the state of the sections 10 and 30 does not change from conducting to nonconducting and vice versa in response to minor fluctuations of input signals. The feedback loop assures that, once turned on, the circuit remains firmly on for the duration of each input pulse and that, once turned off upon termination of each input pulse, the circuit remains firmly off until a new input pulse is applied.

The range of resistance and capacitance used in the feedback loop will vary with particular applications of the invention. In one circuit, operated in a telegraph system at a rate of 110 bits per second, the resistor 46 is 2700 ohms and the capacitor 47 is 82 picofarads. The feedback loop in this one circuit precludes false state changes for minor input signal fluctuations having a peak to peak amplitude of approximately 10 volts and a duration as long as 1 millisecond.

Figure 2:
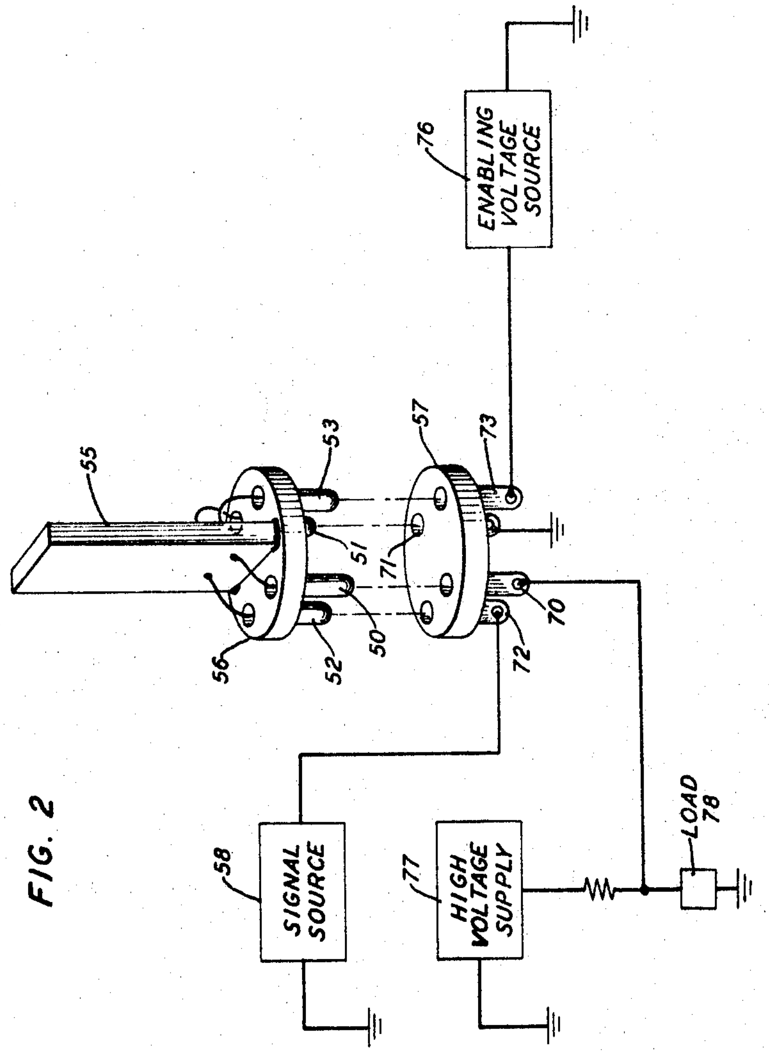
FIG. 2 shows a plug-in arrangement of a printed wiring board that is coupled to external circuits in accordance with the invention.

Referring now to FIG. 2, this invention is shown advantageously constructed as a plug-in substitution for a pentode tube used in telegraph transmission. The designations used to FIG. 2 correspond to similar designations used in FIG. 1, wherever they are applicable. In FIG. 2 the semiconductor circuit, including the input section 10 and the output section 30, is mounted on a printed wiring board 55 that is attached to an epoxy base 56 having pins, or terminals, arranged to fit into a pentode tube socket 57. The pins, or terminals, 50, 51, 52, and 53 represent the pins that are inserted respectively into the pin jacks, or terminals, for the anode, cathode, control grid, and screen grid electrodes of the tube. The tube-plate supply voltage is a positive polarity high voltage supply 77 that is coupled by way of the pin jack, or terminal, 70 to the terminal 50. A negative polarity reference potential, shown illustratively as ground, is coupled by way of the pin jack, or terminal, 71 to the terminal 51. Input signals, which are positive and negative with respect to the reference potential and are normally applied to the control grid of the tube from a telegraph circuit signal source 58, are coupled by way of the pin jack, or terminal, 72 to the terminal 52. The screen grid supply of essentially earth-ground potential is the enabling voltage supply 76 that is coupled by way of the pin jack, or terminal, 73 to the terminal 53. Large current signals produced at the output terminals 50 and 51 in response to the input signals applied to the terminal 52 are coupled to a telegraph hub circuit shown as the load 78.

In this plug-in use, the tube-plate supply voltage is much greater than the punch-through voltage of the transistor Q3 shown in FIG. 1. The SCR Q4 has been selected to have a breakover voltage that exceeds the tube-plate supply voltage applied between the anode and cathode electrodes of the pentode tube. The resistors 41 and 42 are selected to produce across the resistor 42 an enabling voltage substantially less than the punch-through voltage of the transistor Q3 but of sufficient magnitude to trigger the SCR Q4 when a complete external conduction path becomes available. For purposes of the plug-in use, the circuit is advantageously encapsulated in polyurethane so that it is easily handled without mechanical damage.

Figure 3:
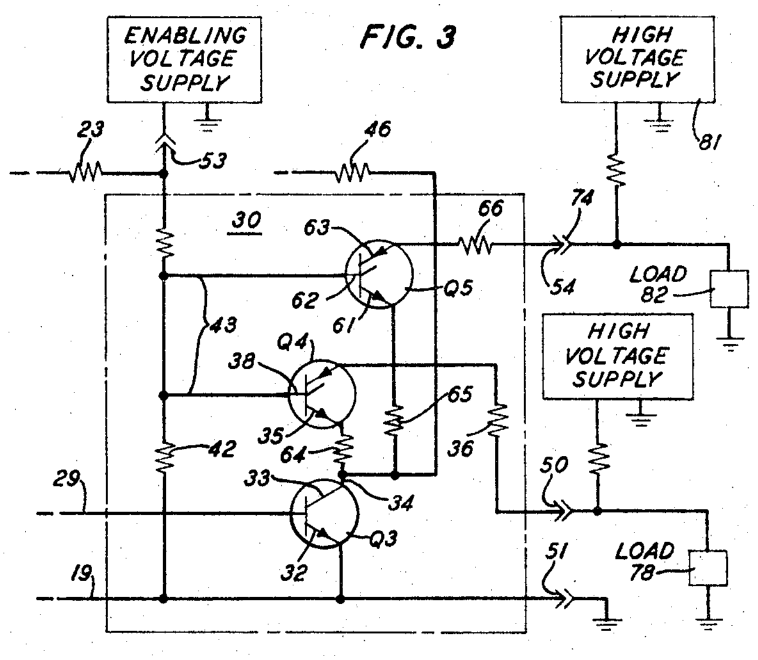
FIG. 3 is a schematic diagram of a second embodiment of the invention having a plurality of isolated output circuits.

In FIG. 3, the invention is shown in a second embodiment. Only the output section 30 is shown in FIG. 3 because it is modified and the input section 10 is unchanged. The designations used in FIG. 3 correspond to similar designations used in FIG. 1, wherever they are applicable. In FIG. 3, the output section 30 operates similarly to the previous description of the embodiment of FIG. 1 except that in the embodiment of FIG. 3 there are two silicon controlled rectifiers Q4 and Q5 that conduct under control of the transistor Q3. The SCR Q5 includes a cathode electrode 61, a gate electrode 62, and an anode electrode 63. The inputs of the silicon controlled rectifiers Q4 and Q5 are bridged by coupling the cathode electrodes 35 and 61, respectively, through isolation resistors 64 and 65 and the lead 34 to the collector electrode 33 of the transistor Q3 and by connecting the gate electrodes 38 and 62 together. The resistors 64 and 65 insure that the first SCR to turn on does not drain so much base current that the other SCR cannot turn on. Of course, when only one SCR is used as in the embodiment of FIG. 1 the resistors 64 and 65 are unnecessary. Leads 43 and the resistor 42 couple the gate electrodes

38 and 62 to the emitter electrode 32 of the transistor Q3 for coupling the enabling voltage to the gate electrodes 38 and 62. A resistor 66 couples the anode 63 to an output terminal 54 which is coupled through a terminal 74 of an external circuit to a positive polarity high voltage supply 81 and a load 82. A supply voltage greater than punch-through voltage of the transistor Q3 but less than breakover voltage of the SCR Q5 is coupled from the high voltage supply 81 to the terminal 54 for producing output current in the load 82. The loads 78 and 82 in this second embodiment of the invention are telegraph loop circuits driven separately by currents through the silicon controlled rectifiers Q4 and Q5 so that the loads are isolated from influencing each other. The transistor Q3 simultaneously controls the conduction of the silicon controlled rectifiers Q4 and Q5 and therefore also controls current conduction to the separate load circuits.

Figure 4:
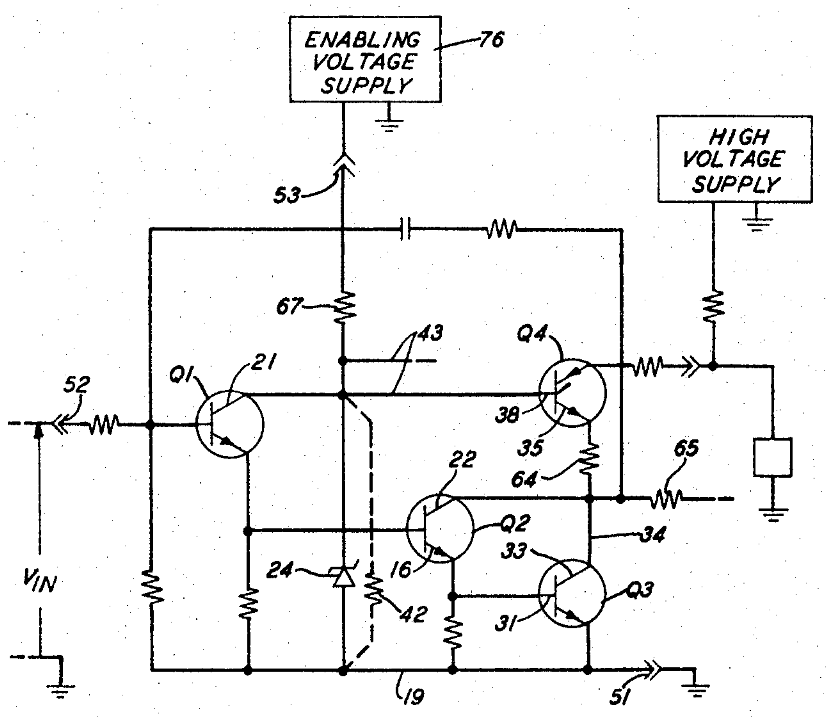
FIG. 4 is a schematic diagram of a third embodiment of the invention for improving base drive current to a control transistor.

Referring now to FIG. 4, there is shown a third embodiment of the invention that provides an alternative means for enabling and operating the transistor Q3 and the SCR Q4. The designations used in FIG. 4 correspond to similar designations used in FIG. 1, wherever they are applicable. In FIG. 4, the resistors 64 and 65 and an extra lead 43 are shown to illustrate interconnections with an additional SCR as described in the embodiment of FIG. 3, but they are not required when only one SCR is used. For a circuit with one SCR Q4, the collector electrode 21 of the transistor Q1 is connected directly via a lead 43 to the gate electrode 38 of the SCR Q4. A resistor 67 couples the terminal 53 to the lead 43, which is coupled by way of the reverse breakdown diode 24 and lead 19 to the terminal 51. The collector electrode 22 of the transistor Q2 is connected directly to the lead 34 that couples the collector electrode 33 of the transistor Q3 to the cathode electrode 35 of the SCR Q4. Emitter electrode 16 of the transistor Q2 is still connected to the base electrode 31. The transistors Q1, Q2, and Q3 are arranged to conduct in saturation when a signal of positive polarity with respect to the reference potential of the terminal 51 is coupled to the input terminal 52 and to be cut off when a negative polarity signal is coupled to the input terminal 52.

The embodiment of FIG. 4 provides an advantage in operation and precludes the need for the resistors 23, 41, and 42 used in the embodiments of FIGS. 1 and 3. Resistor 67 has been added. Diode 24 produces a positive voltage on the lead 43 when reference voltage supply 76 is coupled to the terminal 53 and the terminal 51 is coupled to the reference potential, shown as ground. The positive voltage on the lead 43 is a collector supply voltage for the transistor Q1 and a positive enabling potential for the gate electrode 38 of the SCR Q4. Resistor 42 is shown with dotted leads to indicate optional alternative connections. Although diode 24 alone generally produces satisfactory operation, the resistor 42 may be substituted for the diode in applications in which the enabling voltage supply 76 is relatively stable. Of course, both the diode 24 and the resistor 42 can be employed if desired. The cathode 35 of the SCR Q4 establishes the collector supply voltage for the transistors Q2 and Q3. Transistor Q2 is used as a path from the cathode 35 to the base 31 of transistor Q3 for providing the advantage of additional base drive current to the transistor Q3 to keep the transistor Q3 in saturation whenever the voltage on the lead 34 rises and tends to increase the voltage on the collector electrode 33. In certain uses of this invention, such as driving a telegraph loop, the transistor Q3 uses this additional base drive current to maintain saturated operation whenever a telegraph loop trouble condition causes the collector-emitter voltage of transistor Q3 to rise. Otherwise this rising collector-emitter voltage would tend to take the transistor Q3 out of saturation into the active, or linear, region of operation. The active region of operation is avoided so that the emitter to cathode resistance does not rise and produce excessive heat, which can disturb circuit functions and burn out the transistor Q3.

The above-detailed description is illustrative of three embodiments of the invention and it is to be understood that other embodiments thereof will be obvious to those skilled in the art. These additional embodiments are considered to be within the scope of the invention.

What is claimed is:

1. A two-state switching circuit comprising
a first transistor having collector, emitter, and base electrodes and a predetermined punch-through voltage,
a switching device having first and second output electrodes, a gate electrode, and a breakover voltage greater than the punch-through voltage,
means connecting the collector electrode of the first transistor to the first output electrode,
means for coupling a supply voltage greater than punch-through voltage and less than the breakover voltage to the second output electrode,
means for coupling a fixed enabling voltage less than the punch-through voltage to the gate electrode, and
means for coupling input control signals to the base electrode of the first transistor comprising
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

2. A two-state switching circuit comprising
a first transistor having collector, emitter, and base electrodes and a predetermined punch-through voltage,
a switching device having first and second output electrodes, a gate electrode, and a breakover voltage greater than the punch-through voltage,
means connecting the collector electrode of the first transistor to the first output electrode,
means for coupling a supply voltage greater than the punch-through voltage and less than the breakover voltage to the second output electrode,
means for coupling a fixed enabling voltage less than the punch-through voltage to the gate electrode,
means for coupling input control signals to the base electrode of the first transistor and including an input terminal, and
feedback means coupling the collector electrode of the first transistor to the input terminal, said feedback means precluding the circuit from changing state in response to minor fluctuations of input signal.

3. A circuit in accordance with claim 2 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

4. A two-state switching circuit comprising
a first transistor having collector, emitter, and base electrodes and a predetermined punch-through voltage,
a switching device having first and second output electrodes, a gate electrode, and a breakover voltage greater than the punch-through voltage,
means connecting the collector electrode of the first transistor to the first output electrode,
means for coupling a supply voltage greater than the punch-through voltage and less than the breakover voltage to the second output electrode,
means for coupling a fixed enabling voltage less than the punch-through voltage to the gate electrode and comprising
a voltage divider having a resistor coupling the emitter electrode of the first transistor to the gate electrode for applying a continuous enabling voltage less than the punch-through voltage between the emitter electrode of the first transistor and the gate electrode, and
means for coupling input control signals to the base electrode of the first transistor and comprising
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

5. A two-state switching circuit comprising
a first transistor having collector, emitter, and base electrodes and a predetermined punch-through voltage,
a switching device having first and second output electrodes, a gate electrode, and a breakover voltage greater than the punch-through voltage,
means connecting the collector electrode of the first transistor to the first output electrode,
means for coupling a supply voltage greater than the punch-through voltage and less than the breakover voltage to the second output electrode,
means for coupling a fixed enabling voltage less than the punch-through voltage to the gate electrode and comprising,
a voltage divider having a resistor coupling the emitter electrode of the first transistor to the gate electrode for applying a continuous enabling voltage less than the punch-through voltage between the emitter electrode of the first transistor and the gate electrode,
means for coupling input control signals to the base electrode of the first transistor and including an input terminal, and
feedback means couple the collector electrode of the first transistor to the input terminal, said feedback means precluding the circuit from changing state in response to minor fluctuations of input signal.

6. A circuit in accordance with claim 5 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

7. A circuit in accordance with claim 6 in which
the swtching device comprises a silicon controlled rectifier having a cathode electrode for the first output electrode and an anode electrode for the second output electrode, and
the circuit further comprising an enabling voltage supply coupled to the voltage divider for producing the fixed enabling voltage
a high voltage supply coupled to the means for coupling a supply voltage,
a signal source coupled to the means for coupling input control signals, and
a reference potential coupled to the emitter electrode of the first transistor.

8. A two-state switching circuit comprising
a first transistor having collector, emitter, and base electrodes and a predetermined punch-through voltage,
a switching device having first and second output electrodes, a gate electrode, and a breakover voltage greater than the punch-through voltage,
means connecting the collector electrode of the first transistor to the first output electrode,
means for coupling a supply voltage greater than the punch-through voltage and less than the breakover voltage to the second output electrode,
means for coupling input control signals to the base electrode of the first transistor,
means for coupling a fixed enabling voltage less than the punch-through voltage to the gate electrode,
at least one additional switching device similar to the first mentioned switching device, and
means coupling said first output electrodes of said switching devices together and coupling said gate electrodes of said switching devices together for controlling conduction in all of such devices in response to said control signals.

9. A circuit in accordance with claim 8 in which
the switching devices each comprise a silicon controlled rectifier having a cathode electrode for the first output electrode and an anode electrode for the second output electrode.

10. A circuit in accordance with claim 8 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

11. A circuit in accordance with claim 8 in which
the means for coupling input control signals to the base electrode of the first transistor includes an input terminal, and
feedback means couple the collector electrode of the first transistor to the input terminal, said feedback means precluding the circuit for changing state in response to minor fluctuations of input signal.

12. A circuit in accordance with claim 11 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

13. A circuit in accordance with claim 8 in which
the means for coupling a fixed enabling voltage comprises
a voltage divider having a resistor coupling the emitter electrode of the first transistor to each of the gate electrodes for applying a continuous enabling voltage less than the punch-through voltage between the emitter electrode of the first transistor and each of the gate electrodes.

14. A circuit in accordance with claim 13 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

15. A circuit in accordance with claim 13 in which
the means for coupling input control signals to the base electrode of the first transistor includes an input terminal, and
feedback means couple the collector electrode of the first transistor to the input terminal, said feedback means precluding the circuit from changing state in response to minor fluctuations of input signals.

16. A circuit in accordance with claim 15 in which
the means for coupling input control signals to the base electrode of the first transistor comprises
a second transistor having collector and emitter electrodes,
means connecting the collector electrode of the second transistor to the collector electrode of the first transistor, and
means connecting the emitter electrode of the second transistor to the base electrode of the first transistor for increasing base drive current to the first transistor in response to rising potential on the collector electrode of the first transistor.

17. A circuit in accordance with claim 16 in which
the switching devices each comprise a silicon controlled rectifier having a cathode electrode for the first output electrode and an anode electrode for the second output electrode, and
the circuit further comprising
an enabling voltage supply coupled to the voltage divider for producing the fixed enabling voltage,
a high voltage supply coupled to the means for coupling supply voltage,
a signal source coupled to the means for coupling input control signals, and
a reference potential coupled to the emitter electrode of the first transistor.

References Cited

UNITED STATES PATENTS 3,268,776 8/1966 Reed ____________ 307—252 X

DONALD D. FORRER, Primary Examiner

U.S. Cl. X.R.

307—202, 241, 253, 302, 305, 315